United States Patent [19]
Ohta

[11] Patent Number: 4,737,827
[45] Date of Patent: Apr. 12, 1988

[54] HETEROJUNCTION-GATE FIELD-EFFECT TRANSISTOR ENABLING EASY CONTROL OF THRESHOLD VOLTAGE

[75] Inventor: Kuniichi Ohta, Tokyo, Japan

[73] Assignee: NEC Corporation, Tokyo, Japan

[21] Appl. No.: 824,478

[22] Filed: Jan. 31, 1986

[30] Foreign Application Priority Data

Jan. 31, 1985 [JP] Japan .................................. 60-17378

[51] Int. Cl.$^4$ .................... H01L 27/12; H01L 29/161; H01L 29/80
[52] U.S. Cl. ......................................... 357/16; 357/4; 357/22
[58] Field of Search ............................ 357/22 A, 16, 4

[56] References Cited
FOREIGN PATENT DOCUMENTS 59-210673 11/1984 Japan ............................. 357/22 MD
59-222966 12/1984 Japan ............................. 357/22 MD

OTHER PUBLICATIONS

*Applied Physics Letters*, vol. 28, No. 9, 5/1/76, "Efficient ... $Ga_xIn_{1-x}As_yP_{1-y}$", Pearsall et al., pp. 499–500.

Primary Examiner—Martin H. Edlow
Assistant Examiner—D. Featherstone
Attorney, Agent, or Firm—Sughrue, Mion, Zinn, Macpeak & Seas

[57] ABSTRACT

A heterojunction-gate field-effect transistor comprises an active layer of semiconductor material having source and drain regions, an intermediate layer of another semiconductor material formed on the active layer between the source and drain regions, the intermediate layer inducing a two-dimensional charge layer in a surface portion of the active layer between the source and drain regions, and a gate electrode of a mixed semiconductor crystal formed on the intermediate layer to control the conductivity of the two-dimensional charge layer by an electrical potential applied thereto. The mixed semiconductor crystal may be GaP-InAs or mixed crystal of GaP-InAs mixed crystal and AlP-GaAs, AlsB-GaP, or GaSb-GaP mixed crystal.

14 Claims, 2 Drawing Sheets

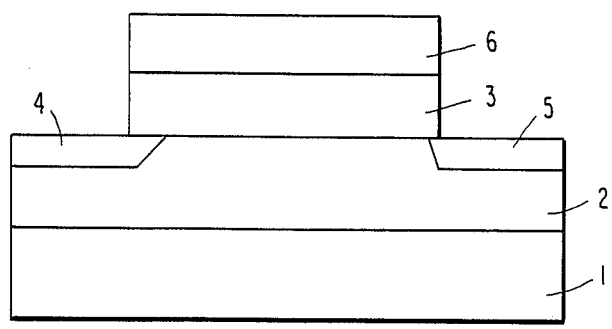
FIG.1(a)
FIG.1(b)
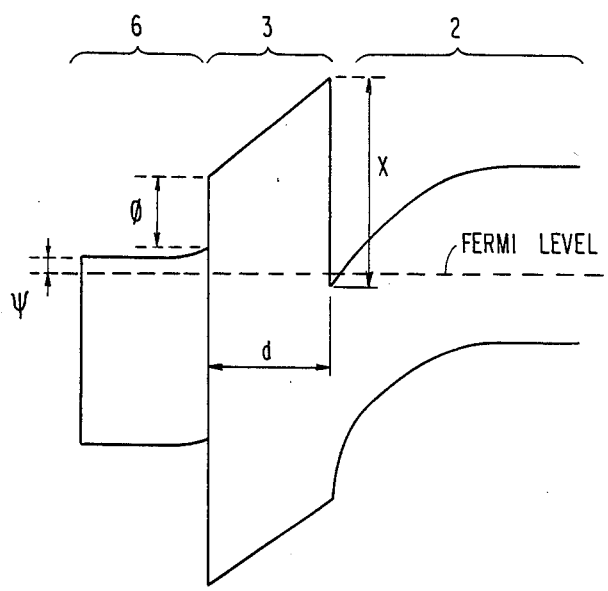

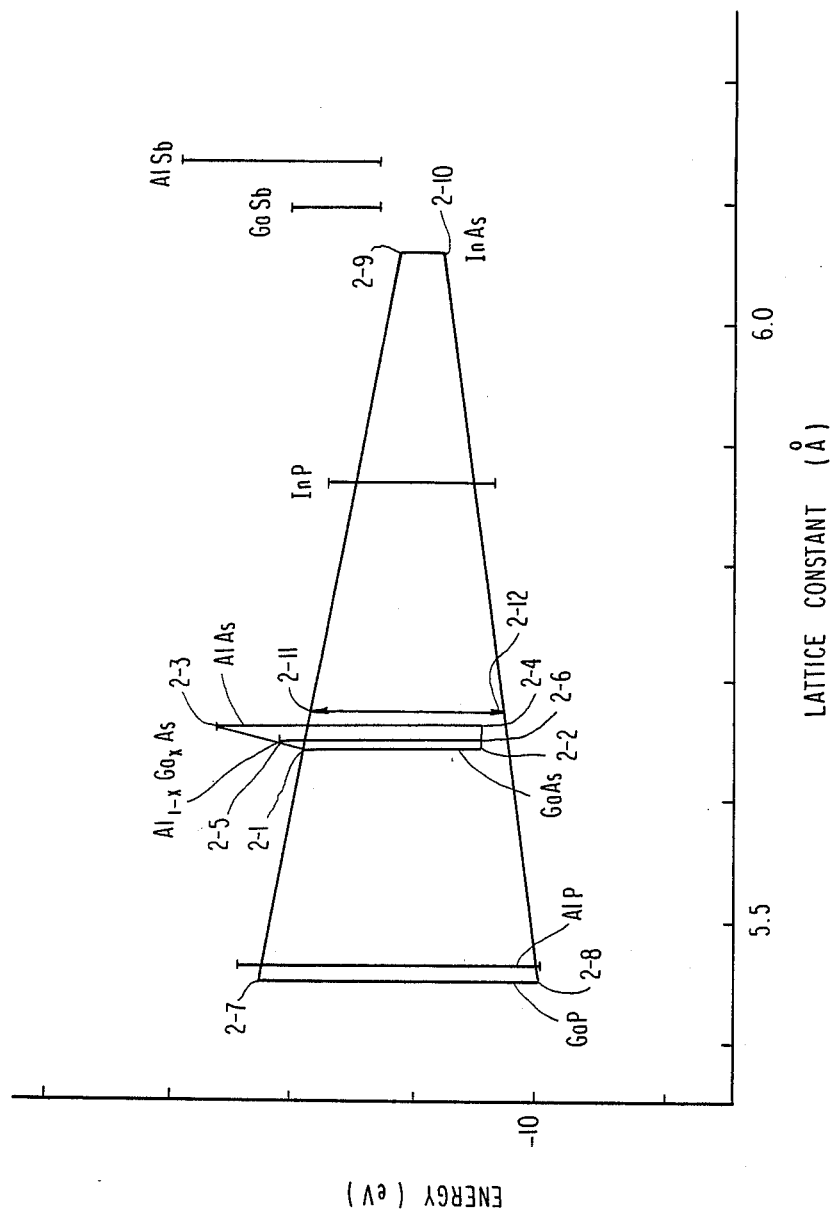

HETEROJUNCTION-GATE FIELD-EFFECT TRANSISTOR ENABLING EASY CONTROL OF THRESHOLD VOLTAGE

BACKGROUND OF THE INVENTION (1) Field of the Invention

The present invention relates to a field-effect transistor having a heterojunction gate structure.

(2) Description of the Prior Art

The field-effect transistor having heterojunction gate structure has been studied with the aim of improving the operable high frequency limit of transistor devices. The prior art field-effect transistor of this type employs an intrinsic or a slightly P-type GaAs layer grown on a semi-insulator GaAs substrate. Source and a drain regions are formed at a surface portion of the GaAs layer. On the surface portion between the source and drain regions is formed a compound semiconductor layer having an energy band structure by which a two-dimensional electron layer is induced on the surface portion of the GaAs layer. A gate electrode is formed on the compound semiconductor layer. An input signal is applied to the gate electrode to modulate the two-dimensional electron layer.

The gate electrode of the prior art is made of a metal or a conductive compound semiconductor doped with donor or acceptor impurities. Such a gate structure has a fixed difference in work function between the GaAs layer and the gate electrode, resulting in lower controllability of the threshold voltage. This causes difficulties in a circuit design having small power consumption, in the formation of complementary type P- and N-channel transistors and in the formation of a depletion type field effect transistor.

SUMMARY OF THE INVENTION

It is, therefore, a primary object of the present invention to provide a heterojunction gate field effect transistor in which the threshold voltage is easily and variably controlled over a wide range.

According to the present invention, there is provided a heterojunction gate field effect transistor comprising an active semiconductor layer having a source and a drain region, an intermediate semiconductor layer formed on the active semiconductor layer between the source and drain regions, the intermediate semiconductor layer having a wider band-gap than the active semiconductor layer to form a two-dimensional layer electrons or holes in a surface portion of the active semiconductor layer between the source and drain regions, and a gate electrode formed on the intermediate semiconductor layer, the gate electrode being made of a mixed semiconductor crystal doped with donor or acceptor impurities.

The mixed crystal is characterized by an energy band gap which varies with the mixing ratio of the constituent semiconductor materials. Therefore, the value of the difference in work function between the intermediate semiconductor layer and the gate electrode material can be controlled over a wide range by the mixing ratio of the semiconductor materials of the gate electrode, resulting in wide-range controllability of the threshold voltage.

The mixed semiconductor crystal for the gate electrode may be a mixed crystal composed of a plurality of mixed semiconductor crystals. In this case, the energy band-gap and the lattice constant can be independently controlled, and the threshold voltage can be controlled with no lattice mismatch between the gate electrode material and the intermediate semiconductor layer material. Thus, the threshold voltage control does not harm other electrical properties.

BRIEF DESCRIPTION OF THE DRAWINGS

The above-mentioned and other objects, features and advantages of the present invention will become more apparent by reference to the following detailed description taken in conjunction with the accompanying drawings, wherein:

FIG. 1(a) is a sectional view of the heterojunction gate field effect transistor according to preferred embodiments of the present invention;

FIG. 1(b) is a diagram of the energy band structure of the preferred embodiments shown in FIG. 1(a); and FIG. 2 is a diagram showing the relationship between energy band-gap and lattice constant insert to explain the selection of the mix ratio of the semiconductor gate electrode materials according to preferred embodiments of the present invention.

DESCRIPTION OF THE PREFERRED EMBODIMENTS

A first preferred embodiment uses a mixed semiconductor of GaP and InAs as a gate electrode material and has a sectional structure as shown in FIG. 1(a). A semi-insulator GaAs is used as a substrate 1. An intrinsic or a slightly P-type GaAs layer 2 is used as an active semiconductor layer 2. The layer 2 is grown on the GaAs substrate 1. $N^+$-type source and drain regions 4 and 5 are formed in a surface portion of the GaAs layer 2 by diffusing impurities. On the surface of the GaAs layer 2 between the source and drain regions 4 and 5 is grown an intermediate semiconductor layer 3 of $Al_{1-x}Ga_xAs$. The $Al_{1-x}Ga_xAs$ layer 3 may be intrinsic or slightly doped with N-type impurities. A gate electrode 6 is formed on the $Al_{1-x}Ga_xAs$ intermediate layer 3 by a mixed semiconductor of GaP and InAs. The mixed semiconductor layer 6 is doped with N-type impurities.

The energy band structure of the thus formed heterojunction gate field effect transistor is shown in FIG. 1(b). "$\phi$" is the energy level difference between the lower edges of conduction bands of the mixed semiconductor layer 6 and the $Al_{1-x}Ga_xAs$ layer 3 which form a discontinuity at their interface. "X" is the energy level difference between lower edges of the conduction bands of the $Al_{1-x}Ga_xAs$ layer 3 and the GaAs layer 2, which form another discontinuity at their interface. The lower edge of the conduction band of the GaAs layer 2 curves downward and crosses the Fermi level to form a two-dimensional electron layer at the boundary between the $Al_{1-x}Ga_xAs$ 3 and the GaAs layer 2. The value of "X" is 0.3 eV when "x" in $Al_{1-x}Ga_xAs$ is 0.3, that is, $Al_{0.7}Ga_{0.3}As$. "$\Psi$" is the difference between the lower edge of the conduction band of the mixed semiconductor layer 6 and the Fermi level. Where the thickness of the $Al_{1-x}Ga_xAs$ layer 3 and its donor concentration are represented by "d" and "N", respectively, the threshold voltage $V_T$ of the heterojunction gate field effect transistor of the first embodiment can be expressed by $$V_T = \Psi + \phi - X - (qN/2\epsilon)d^2$$

where "$\epsilon$" is the dielectric constant of the $Al_{1-x}Ga_xAs$.

The threshold voltage $V_T$ can be changed by controlling the value of "$\phi$" which can be controlled by changing the mixing ratio of the mixed semiconductor used for the gate electrode 6. This will be explained with reference to FIG. 2.

First, a description will be given with respect to the mixed semiconductor of the $Al_{1-x}Ga_xAs$ layer 3. When the mixing ratio of GaAs (the lower edge of its conduction band is represented by 2-1 and the upper edge of its valence band by 2-2) and AlAs (the lower edge of its conduction band is indicated by 2-3 and the upper edge of its valence band by 2-4) is changed, the relationship between the lower edge of conduction band and the lattice constant and the relationship between the upper edge of the valence band and the lattice constant are expressed by the line between points 2-1 and 2-3 and the line between points 2-2 and 2-4, respectively. The lattice constant of the mixed semiconductor $Al_{1-x}Ga_xAs$ is located at a point dividing the difference of the lattice constants of GaAs and AlAs by the ratio $1-x:x$. The lower edge of the conduction band of $Al_{1-x}Ga_xAs$ and the upper edge of its valence band vary between the points 2-1 and 2-3 and between 2-2 and 2-4, respectively, in accordance with a second order equation in "x". Their variation can be approximated by the straight lines 2-1 to 2-3 and 2-2 to 2-4 between the corresponding values for GaAs and AlAs. The lattice constant and the edges of the energy band gap are expressed as lines 2-5 and 2-6, where "x" is 0.3 ($Al_{0.7}Ga_{0.3}As$). The lattice constant of $Al_{0.7}Ga_{0.3}As$ is approximately matched with that of the GaAs of the layer 2.

The description will now be directed to the mixed semiconductor crystal of the gate electrode 6. If the mix ratio of GaP (the lower edge of the conduction band is line 2-7 and the upper edge of the valence band is line 2-8) and InAs (the lower edge of the conduction band is line 2-9 and the upper edge of the valence band is 2-10) is represented by line changed, the mixed crystal of GaP and InAs will have a conduction band lower edge and a valence band upper edge which will vary along line 2-7 to 2-9 and line 2-8 to 2-10, respectively. To match the lattice constant of the mixed crystal with that of the GaAs of the layer 2, an energy band gap should be as indicated by line 2-11 to 2-12. The line 2-7 to 2-9 of the lower edge of the conduction band is actually sloped in accordance with a second order equation rather than the straight line shown in FIG. 2. Therefore, the value which would be "$\phi$" is larger than the value expected from FIG. 2. If some lattice constant mismatch is allowed, the value "$\phi$" can be controlled by changing the mixing ratio of GaP and InAs. Thus, the threshold voltage $V_T$ can be controlled.

Another method of controlling the threshold voltage $V_T$ is to vary the amount of impurities in the mixed crystal of the gate electrode 6. If the concentration of a donor such as Si in increased, the value "$\Psi$" is made small. Changing the value "$\Psi$" is another way of controlling the threshold voltage as is apparent from the above threshold voltage equation. On the other hand, if the mixed crystal of the gate electrode 6 is doped with an acceptor such as Be or Zn to become P-type, the Fermi level approaches the valence band of the mixed crystal thereby to enlarge the value "$\Psi$" and to enlarge the threshold voltage $V_T$. Thus, the threshold voltage $V_T$ can be controlled within a wide range and either an enhancement type field effect transistor or a depletion type field effect transistor can be realized.

A second preferred embodiment of the present invention uses a mixed crystal of a GaP-InAs mixture and an AlP-GaAs or AlSb (or GaSb)-GaP mixture as the gate electrode 6. The remainder of the device structure is the same as in the first embodiment shown in FIG. 1(a). The energy band structure is also similar to FIG. 1(b).

In case of using a mixed crystal of two compound semiconductor crystals, the lattice constant need not change with the energy band-gap, i.e., by selecting the mixing ratio the energy band-gap can be solely controlled while the lattice constant is held constant. The lower edges of the conduction band and the upper edges of the valence band for AlP, AlSb and GaSb are also shown in FIG. 2. The lower edges of the conduction band and the upper edges of the valence band of the mixed crystal AlP-GaAs and AlSb (or GaSb)-GaP vary respectively along lines (not shown) between lower edges of the conduction bands of AlP and GaAs and AlSb (or GaSb) and GaP and lines (not shown) between the upper edges of the valence bands of AlP and GaAs and AlSb (or GaSb) and GaP. By selecting the mixing ratio of AlP and GaAs or the mixing ratio of AlSb (or GaSb) and GaP, a suitable energy band gap is obtained. Similarly, by selecting the mixing ratio of the two mixtures of AlP-GaAs and GaP-InAs or AlSb (or GaSb)-GaP and GaP-InAs, the lattice constant and the energy band-gap are independently controlled. Particularly, the value "$\phi$" can be linearly changed while the lattice constant is held constant.

Another merit of using mixtures of four compound semiconductor crystals is in that the curve of the lower edge of the conduction band and that of an upper edge of the valence band of the mixed semiconductor 6 can be controlled at the boundary of the interface with the intermediate semiconductor layer 3. If the mixed crystal of AlP-GaAs or AlSb (or GaSb)-GaP is mixed with the mixed crystal of GaP-InAs and grown on the $Al_{1-x}Ga_xAs$ intermediate semiconductor layer 3 to form the gate electrode 6, the lower edge of the conduction band and the upper edge of the valence band of the resultant gate electrode 6 curve upward at the boundary with the $Al_{1-x}Ga_xAs$ intermediate semiconductor 3 to decrease the value "$\phi$" and therefore decrease the threshold voltage $V_T$. This curve makes the control of the threshold voltage $V_T$ more broadly obtainable.

In the above description, an N-channel field effect transistor is discussed. However, the same principles can be applied to P-channel field effect transistors. The present invention can be equally applied to N- and P-channel heterojunction gate field effect transistors.

Furthermore, a plurality of herterojunction gate field effect transistors can be formed on a single GaAs layer 2, which are electrically separated by converting portions of the GaAs layer 2 between the transistors into insulating material by implanting hydrogen ions thereinto, whereby an integrated circuit of heterojunction gate field effect transistors is achieved. Particularly, different mixed crystals may be used for the gate electrodes of different heterojunction gate field effect transistors to realize both N- and P-channel heterojunction gate field effect transistors in a single integrated circuit, to thereby form a complementary field effect integrated circuit which has low power consumption. Low power consumption is also obtained in a circuit using heterojunction gate field effect transistors having a small threshold voltage.

In the above embodiments, an intrinsic or slightly P-type GaAs layer 2 is used as an active layer. However, other compound crystals such as InP, InAs, GaSb, AlSb, and InSb or mixed crystals thereof may be used for the active layer. Furthermore, if a P-type layer is to be used as the active layer, the heterojunction gate field effect transistors formed on a single substrate may be electrically isolated by using an N-type semi-insulator GaAs substrate 1. An insulator substrate may obviously be used instead of the semi-insulator GaAs Substrate 1. The mixed compound semiconductor crystal used in the gate electrode may consist of two or more of compound semiconductor crystals such as GaP, InAs, AlP, InP, GaAs, GaSb, AlSb and AlAs. Mixed semiconductor crystals of three or more compound semiconductor crystals may be made by mixing a plurality of mixed compound semiconductor crystals which each consist of two compound semiconductor crystals such as GaP, InAs, AlP, InP, GaAs, GaSb, AlSb and AlAs.

What is claimed is:

1. A heterojunction gate field effect transistor comprising:
    an active layer of a first semiconductor material;
    source and drain impurity doped regions formed in a surface portion of said active layer;
    an intermediate layer of a second semiconductor material formed on said active layer between said source and drain regions, said second semiconductor material having a wider energy band-gap than said first semiconductor material and inducing a two-dimensional charge layer in said surface portion of said active layer between said source and drain regions; and
    a gate electrode formed on said intermediate layer, said gate electrode including a mixed semiconductor crystal comprised of at least two III-V compound semiconductors, and being doped with impurities, and said gate electrode receiving an electric potential to control the conductivity of said two-dimensional charge layer.

2. A heterojunction gate field effect transistor as claimed in claim 1, wherein said mixed semiconductor crystal consists of two compound semiconductors.

3. A heterojunction gate field effect transistor as claimed in claim 1, wherein said mixed semiconductor crystal is a GaP-InAs mixed crystal.

4. A heterojunction gate field effect transistor as claimed in claim 2, wherein said active layer is formed on a substrate of insulating or semi-insulating material.

5. A heterojunction gate field effect transistor as claimed in claim 4, wherein said substrate is a semi-insulating GaAs substrate, said first and second semiconductor materials being an intrinsic or slightly P-type GaAs and $Al_{1-x}Ga_xAs$, respectively.

6. A heterojunction gate field effect transistor as claimed in claim 5, wherein said mixed semiconductor crystal is a GaP-InAs mixed crystal.

7. A heterojunction gate field effect transistor as claimed in claim 1, wherein said mixed semiconductor crystal consists of four III-V compound semiconductors.

8. A heterojunction gate field effect transistor as claimed in claim 7, wherein said active layer is formed on a substrate of a semi-insulating GaAs, said first and second semiconductor materials being a semi-insulating or slightly P-type GaAs and $Al_{1-x}Ga_xAs$, respectively.

9. A heterojunction gate field effect transistor as claimed in claim 8, wherein said mixed semiconductor crystal is selected from the group of mixed semiconductor crystals of AlSb-GaP-InAs-GaP and GaSb-GaP-InAs-GaP.

10. A heterojunction gate field effect transistor comprising:
    an active layer of a III-V compound semiconductor material;
    source and drain impurity doped regions formed in a surface portion of said active layer;
    an intermediate layer of a second semiconductor material formed on said active layer between said source and drain regions, said second semiconductor material having a wider energy band-gap than said first semiconductor material and inducing a two-dimensional charge layer in said surface portion of said active layer between said source and drain regions; and
    a gate electrode formed on said intermediate layer and made of a third semiconductor material, said third semiconductor material being an impurity doped region composed of a mixture of at least two mixed crystals selected from the group consisting of GaP, InAs, AlP, InP, GaAs, GaSb, AlSb and AlAs; and said gate electrode receiving an electrical potential to control the conductivity of said two-dimensional charge layer.

11. A heterojunction gate field effect transistor as claimed in claim 10, wherein said first semiconductor material is a semi-insulating or slightly P-type GaAs, said second semiconductor material being $Al_{1-x}Ga_xAs$.

12. A heterojunction gate field effect transistor as claimed in claim 11, wherein said active layer is formed on a substrate of insulator or semi-insulator material.

13. A heterojunction gate field effect transistor as claimed in claim 12, wherein said substrate is made of semi-insulating GaAs.

14. A heterojunction gate field effect transistor, comprising:
    an active layer of a first semiconductor material;
    source and drain impurity doped regions formed in a surface portion of said active layer;
    an intermediate layer of a second semiconductor material formed on said active layer between said source and drain regions, said second semiconductor material having a wider energy band-gap than said first semiconductor material and inducing a two-dimensional charge layer in said surface portion of said active layer between said source and drain regions;
    a gate electrode formed on said intermediate layer and made of a third semiconductor material comprised of at least two III-V compound semiconductors;
    and means for adjusting the threshold value of said heterojunction gate field effect transistor by controlling relative proportions of said at least two III-V compound semiconductors in said third semiconductor layer.

* * * * *

UNITED STATES PATENT AND TRADEMARK OFFICE
CERTIFICATE OF CORRECTION

PATENT NO. : 4,737,827
DATED : April 12, 1988
INVENTOR(S) : OHTA

It is certified that error appears in the above-identified patent and that said Letters Patent is hereby corrected as shown below:

Column 2, line 20, after "constant" delete "insert" and insert --,--

Column 3, line 37, after "is" insert --represented by line--

Column 3, line 38, delete "represented by line"

Column 3, line 48, delete "which would be"

Column 3, line 48, after "value" insert --which would be--

Signed and Sealed this

Seventh Day of February, 1989

*Attest:*

DONALD J. QUIGG

*Attesting Officer*     *Commissioner of Patents and Trademarks*